US010495268B1

(12) United States Patent
Cantore et al.

(10) Patent No.: US 10,495,268 B1
(45) Date of Patent: Dec. 3, 2019

(54) HIGH INTENSITY SOLID STATE WHITE EMITTER WHICH IS LASER DRIVEN AND USES SINGLE CRYSTAL, CERAMIC OR POLYCRYSTALLINE PHOSPHORS

(71) Applicant: The Regents of the University of California, Oakland, CA (US)

(72) Inventors: Michael Cantore, Goleta, CA (US); Shuji Nakamura, Santa Barbara, CA (US); Steven P. DenBaars, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 763 days.

(21) Appl. No.: 14/930,201

(22) Filed: Nov. 2, 2015

Related U.S. Application Data

(60) Provisional application No. 62/073,503, filed on Oct. 31, 2014.

(51) Int. Cl.
*F21K 9/64* (2016.01)
*F21K 99/00* (2016.01)
(Continued)

(52) U.S. Cl.
CPC .............. *F21K 9/56* (2013.01); *H01S 5/0092* (2013.01); *F21Y 2101/025* (2013.01)

(58) Field of Classification Search
CPC ..... F21K 9/56; F21K 9/62; F21K 9/64; F21Y 2101/025; H01S 5/0092
See application file for complete search history.

(56) References Cited

U.S. PATENT DOCUMENTS

| 7,601,276 B2 * | 10/2009 | Li ....................... C09K 11/7734 |
| | | 252/301.4 F |
| 2005/0093430 A1 * | 5/2005 | Ibbetson ............... H01L 33/505 |
| | | 313/501 |

(Continued)

OTHER PUBLICATIONS

The Encyclopedia of Laser Physics and Technology, Edge-emitting semiconductors, accessed Feb. 20, 2018, published May 18, 2006. (https://web.archive.org/web/20060518134152/https://www.rp-photonics.com/edge_emitting_semiconductor_lasers.html).*

(Continued)

*Primary Examiner* — Robert J May
*Assistant Examiner* — Leah Simone Macchiarolo
(74) *Attorney, Agent, or Firm* — Gates & Cooper LLP

(57) ABSTRACT

A white light emitting device includes an edge-emitting laser diode, such as a III-nitride laser diode, emitting light in a first wavelength range that is converted to light at a longer wavelength by a single crystal, ceramic or polycrystalline phosphor, such as a Ce:YAG single crystal phosphor, wherein the phosphor absorbs only some of the light emitted from the laser diode, such that a combination of remaining light emitted from the laser diode with the light at the longer wavelength emitted from the phosphor results in emission of high-intensity white light from the device. Reflectors on either side of the edge-emitting III-nitride laser diode reflect the light from both ends of the edge-emitting laser diode towards the phosphor. One or more sides of the phosphor may roughened, or a scattering layer may be added, to promote uniform color mixing of the emissions.

21 Claims, 4 Drawing Sheets

(51) Int. Cl.
*H01S 5/00* (2006.01)
*F21Y 101/02* (2006.01)

(56) References Cited

U.S. PATENT DOCUMENTS

| | | | | |
|---|---|---|---|---|
| 2006/0097385 | A1* | 5/2006 | Negley | H01L 33/486 |
| | | | | 257/722 |
| 2007/0091945 | A1* | 4/2007 | Ferstl | H01S 5/02216 |
| | | | | 372/38.1 |
| 2009/0184616 | A1* | 7/2009 | Van De Ven | H05B 33/086 |
| | | | | 313/1 |
| 2011/0018026 | A1* | 1/2011 | Konno | H01L 33/50 |
| | | | | 257/100 |
| 2011/0180780 | A1* | 7/2011 | Yoo | C09K 11/0883 |
| | | | | 257/13 |
| 2011/0279015 | A1* | 11/2011 | Negley | F21K 9/137 |
| | | | | 313/501 |
| 2012/0087103 | A1* | 4/2012 | Dai | F21V 9/16 |
| | | | | 362/84 |
| 2013/0114242 | A1* | 5/2013 | Pickard | F21V 9/16 |
| | | | | 362/84 |
| 2014/0072812 | A1* | 3/2014 | Hamada | H01S 5/02296 |
| | | | | 428/432 |

OTHER PUBLICATIONS https://sites.google.com/site/dtrlpf/_/rsrc/1395557005568/home/diodes/ndb7a75-3-5w-445nm-diodes/NDB7A75.png.
https://mkt-intl.com/materials/single-crystals-optical-materials/scintillator-crystals/#YAG:Ce.

* cited by examiner

HIGH INTENSITY SOLID STATE WHITE EMITTER WHICH IS LASER DRIVEN AND USES SINGLE CRYSTAL, CERAMIC OR POLYCRYSTALLINE PHOSPHORS

CROSS REFERENCE TO RELATED APPLICATIONS

This application claims the benefit under 35 U.S.C. Section 119(e) of and commonly-assigned U.S. Provisional Application Ser. No. 62/073,503 filed on Oct. 31, 2014 by Michael Cantore, Shuji Nakamura, and Steven P. DenBaars, entitled "HIGH INTENSITY SOLID STATE WHITE EMITTER WHICH IS LASER DRIVEN AND USES SINGLE CRYSTAL, CERAMIC OR POLYCRYSTALLINE PHOSPHORS,";

which application is incorporated by reference herein.

This application is related to U.S. patent application Ser. No. 14/424,790, filed on Feb. 27, 2015, by Ram Seshadri, Steven P. DenBaars, Kristin A. Denault, and Michael Cantore, entitled "HIGH-POWER, LASER-DRIVEN, WHITE LIGHT SOURCE USING ONE OR MORE PHOSPHORS," which application claims priority to International Patent Application No. PCT/US2013/057538, filed Aug. 30, 2013, by Ram Seshadri, Steven P. DenBaars, Kristin A. Denault, and Michael Cantore, entitled "HIGH-POWER, LASER-DRIVEN, WHITE LIGHT SOURCE USING ONE OR MORE PHOSPHORS," which application claims the benefit under 35 U.S.C. Section 119(e) of U.S. Provisional Patent Application Ser. No. 61/695,120, filed Aug. 30, 2012, by Ram Seshadri, Steven P. DenBaars, Kristin A. Denault, and Michael Cantore, entitled "HIGH-POWER, LASER-DRIVEN, WHITE LIGHT SOURCE USING ONE OR MORE PHOSPHORS,";

all of which applications are incorporated by reference herein.

BACKGROUND OF THE INVENTION

1. Field of the Invention

This invention is related to a high-intensity, solid-state, white light emitter which is laser driven and uses single crystal, ceramic, or polycrystalline phosphors.

2. Description of the Related Art (Note: This application references a number of different publications and patents as indicated throughout the specification by one or more reference numbers in brackets, e.g., [x]. A list of these different publications and patents ordered according to these reference numbers can be found below in the section entitled "References." Each of these publications and patents is incorporated by reference herein.)

Conventional white light emitters based on light-emitting diodes (LEDs) suffer from an efficiency droop with increasing electrical current. This results in less efficient devices when run at high power. Thus, to preserve the efficiency of an illuminator constructed with LED devices, many LEDs are usually required.

Laser diodes (LDs), on the other hand, do not suffer from this efficiency droop and can achieve a high optical power density at high efficiency. However, a problem arises in that conventional powdered phosphor wavelength converters must be held in matrix of a polymer material, which is susceptible to damage at a high optical power density.

Thus, there is a need for improved methods of using laser diodes with phosphors in white light emitters. The present invention satisfies this need.

SUMMARY OF THE INVENTION

To overcome the limitations in the prior art described above, and to overcome other limitations that will become apparent upon reading and understanding the present specification, one or more embodiments of the present invention disclose a white light emitting device comprised of a laser diode emitting light in a first wavelength range that is converted to light at a longer wavelength by a single crystal, ceramic, or polycrystalline phosphor, wherein the phosphor absorbs only some of the light emitted from the laser diode, such that a combination of remaining light emitted from the laser diode with the light at the longer wavelength emitted from the phosphor results in emission of high-intensity white light from the device.

The white light can have an intensity of at least 1100 lumens (lm) and be emitted with an efficiency of at least 75 lumens per Watt (lm/W) at the intensity of 1100 lumens. The output power incident on the phosphor and the phosphor's structure can be such that the white light is emitted with an efficiency (in lm/W) between 85% and 100% of the peak efficiency, for the white light having an intensity in a range of 500-1100 lumens. The white light can have a color rendering index of at least 60 and/or a color temperature of at most 7300 K, for example.

The laser diode can have an output power of 4 Watts. The laser diode can comprise an edge-emitting III-nitride laser diode emitting near-ultraviolet (UV) or blue light. The longer wavelength light emitted from the phosphor can comprise light having a peak intensity corresponding to yellow light.

The device can include reflectors on either side of the edge-emitting III-nitride laser diode that reflect the light from both ends of the laser diode towards the phosphor.

The phosphor may comprise a Cerium doped Yttrium Aluminum Garnet (Ce:YAG) single crystal phosphor, but may also comprise a ceramic or polycrystalline Ce:YAG phosphor. Preferably, the phosphor is incorporated into the laser diode's packaging, but it may also be placed remotely from the laser diode's packaging.

One or more sides of the phosphor may roughened to promote uniform mixing of the laser diode's emissions with the phosphor's emissions. Alternatively, or in addition, a scattering layer may be added before or after the phosphor to provide uniform color mixing and safer wide angle distribution of the laser diode's emission.

The device can be such that the white light's intensity at 1100 lm is not reduced after 10 minutes of operation.

One or more embodiments of the invention further disclose a method of fabricating a white light emitting device, comprising obtaining a laser diode emitting first electromagnetic radiation having an output power in a first wavelength range; and positioning at least one phosphor chosen from a single crystal phosphor, a ceramic phosphor, and a polycrystalline phosphor, wherein the phosphor emits second electromagnetic radiation in response to the phosphor absorbing some of the first electromagnetic radiation, and a combination of remaining first electromagnetic radiation and the second electromagnetic radiation comprises 1100 lumens of white light.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Technical Description

Figure 1:
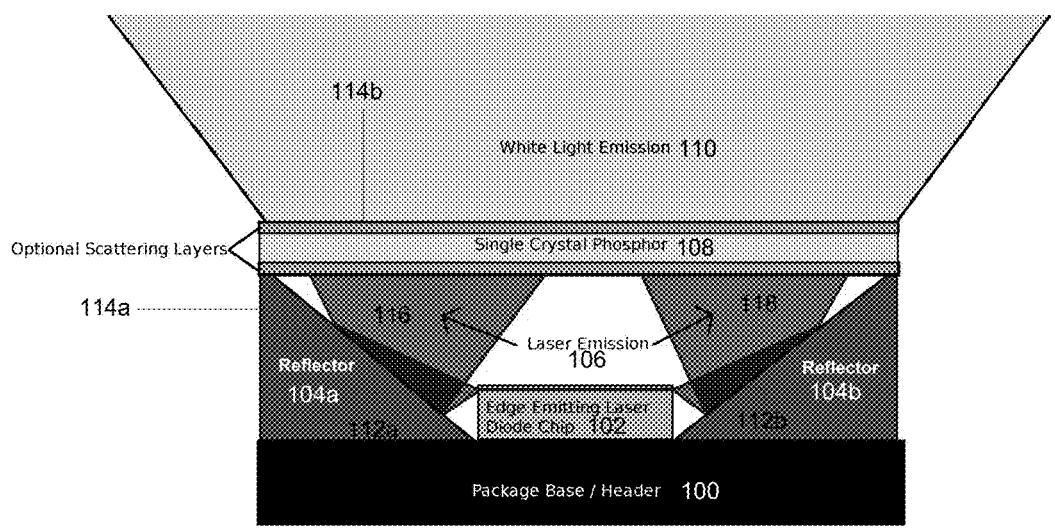
FIG. 1 is a schematic of a white emitter package comprised of an edge-emitting III-nitride laser diode and phosphor, according to one or more embodiments of the invention.

FIG. 1 is a schematic of a white light emitting device according to one embodiment of the present invention. The device is comprised of a package base or header 100, an edge-emitting laser diode chip 102 sitting or positioned on the header 100, and reflectors 104a, 104b on either side of the laser diode chip 102 that reflect the light/laser emissions 106 emitted by the laser chip 102 towards a phosphor 108. The phosphor 108 absorbs only some of the light emissions 106 from the laser diode chip 102 and emits a band of longer wavelength light in response thereto. The combination of the remaining emissions from the laser diode 102, with the longer wavelength emissions emitted from the phosphor 108, results in the high-intensity white light emission 110 from the device.

The edge-emitting laser diode chip 102 may be comprised of a III-nitride based material system, such as an InGaN laser diode, and preferably emits near-UV or blue light.

The phosphor may be a Ce:YAG single crystal phosphor. Alternatively, the single crystal phosphor may be replaced with a ceramic or polycrystalline phosphor material.

Although the phosphor is shown as being incorporated into the laser diode's packaging, it may be remotely placed from the laser diode's packaging. When incorporated into the laser diode's packaging, the phosphor may be located on top of a double reflector 104a-104b that guides emission from both ends/edges 112a-112b of the edge-emitting laser diode chip 102 towards the phosphor 108.

A scattering layer 114a-b may be added before or after the phosphor 108 to provide uniform color mixing and safer wide-angle distribution of the laser diode emission 106. Alternatively, or in addition, one or more sides of the phosphor may be roughened to promote uniform mixing of the laser diode's emissions with the phosphor's emissions.

Figure 2A:
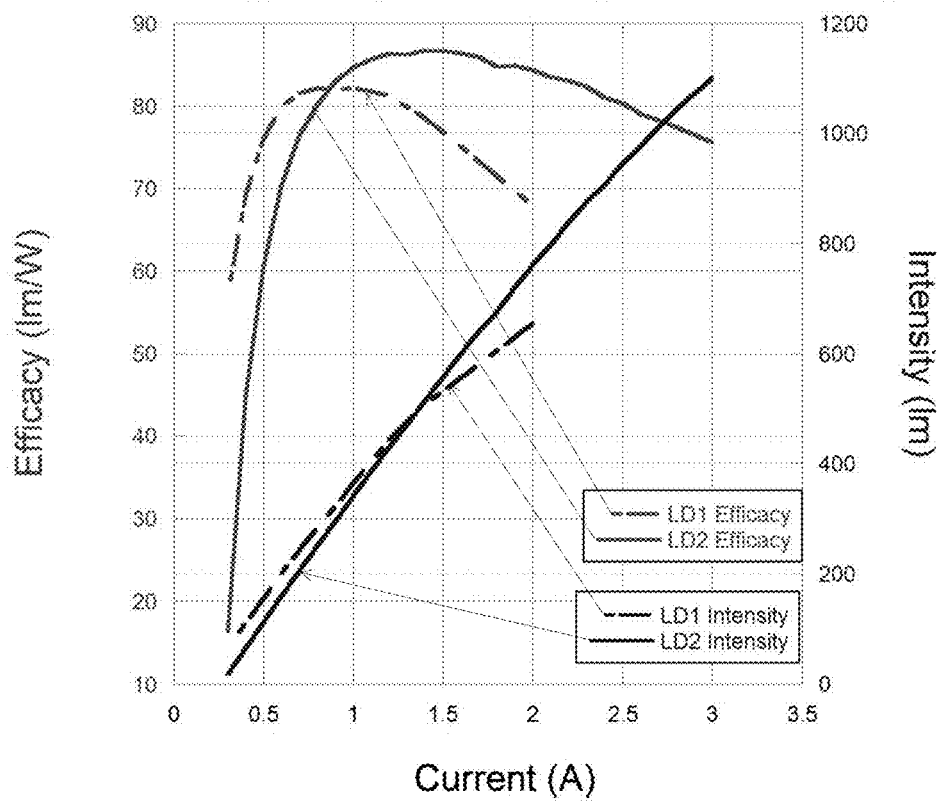
FIG. 2A is a graph that shows the luminous intensity and luminous efficacy of tests with two different laser diodes and a single crystal phosphor, according to one or more embodiments of the invention.

FIG. 2A is a graph that shows the luminous intensity and luminous efficacy of tests with two different 445 nanometer (nm) laser diodes, LD1 and LD2 irradiating a Ce:YAG single crystal phosphor to produce white light (formed by the combination of the 445 nm wavelength radiation emitted from LD1 or LD2 and the yellow light emitted by the phosphor in response to the irradiation with the 445 nm wavelength radiation). The tests, plotting efficiency (lm/W) and intensity (lm) of the white light as a function of the current driving LD1 or LD2, have demonstrated that these high intensity emitters are capable of general illumination. Specifically, a single III-nitride laser diode emitting at a wavelength of 445 nm onto a Ce:YAG single crystal phosphor produced 1100 lm at an efficiency of 75.6 lm/W. The white emission from the combination of the laser diode and the phosphor measured in FIG. 2A had a correlated color temperature of 7300K and color rendering index Ra value of 61.5.

LD2, used to obtain the white light having an intensity of 1100 lm and measured in FIG. 2A, was a Nichia model NBD7A75. LD1 was a blue laser diode removed from a Casio XJ-M140 projector (the Casio XJ-M140 projector uses the LD1 diode as a pump for green phosphor emission) and the LD1 laser diode has the specification given by [1]. The present invention notes that the current of 3 Amps (A) passing through LD2 (used to obtain the white light output of 1100) is the absolute maximum current suggested by the datasheet (most reported values on the data sheet are for a lower operating current). The present invention estimates from the loss of the system that the laser LD2 is emitting between 4 and 5 watts (W) of blue light at 3 A.

The phosphor crystal used to obtain the white light having the intensity of 1100 lm in FIG. 2A was single crystal Cerium (Ce) doped Yttrium Aluminum Garnet (YAG) by Marketech International, with Ce doping of 0.15 weight % Ce and having specifications given by [2].

The spectrometer used to measure the data in FIG. 2A was a charge coupled device (CCD) detector where each pixel of the CCD measures a very small portion of the wavelength spectrum (~1 nanometer (nm) range). While each pixel saturates at some maximum input power, resulting in low maximum power measurement capability for small wavelength range spectra, a much larger maximum power could be measured for spectra where the power is distributed across a wide band of wavelengths. For this reason, we did not measure the laser's power output above about 2W at the laser output wavelength(s) (i.e., we did not measure the laser output alone), but the present invention did use the spectrometer to measure the much broader white emission from the system comprising the LD coupled with the phosphor, as the power of this white emission is distributed over a much larger range of wavelengths.

Figure 2B:
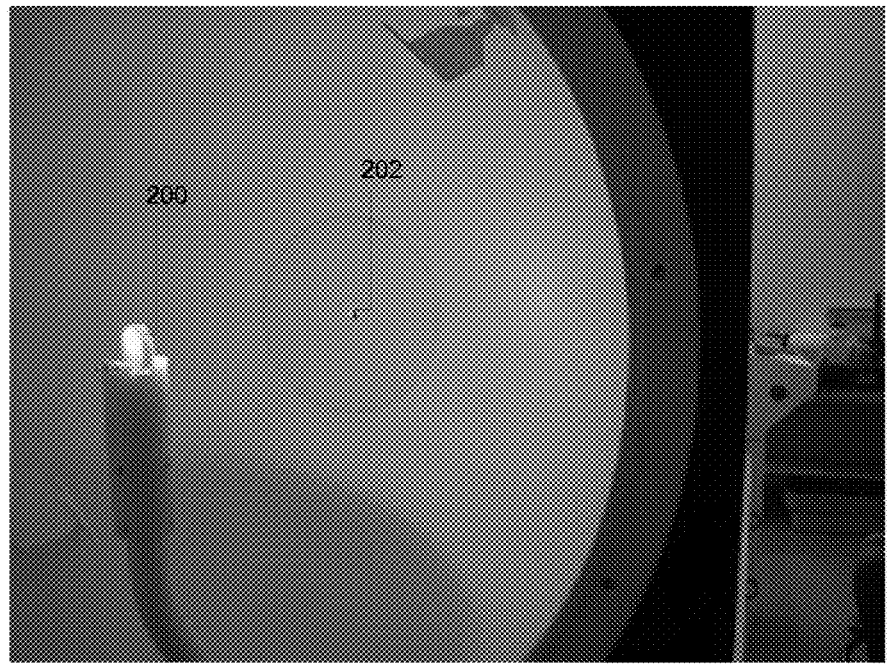
FIG. 2B shows the experimental set up used to obtain the data in FIG. 2A.
Figure 2C:
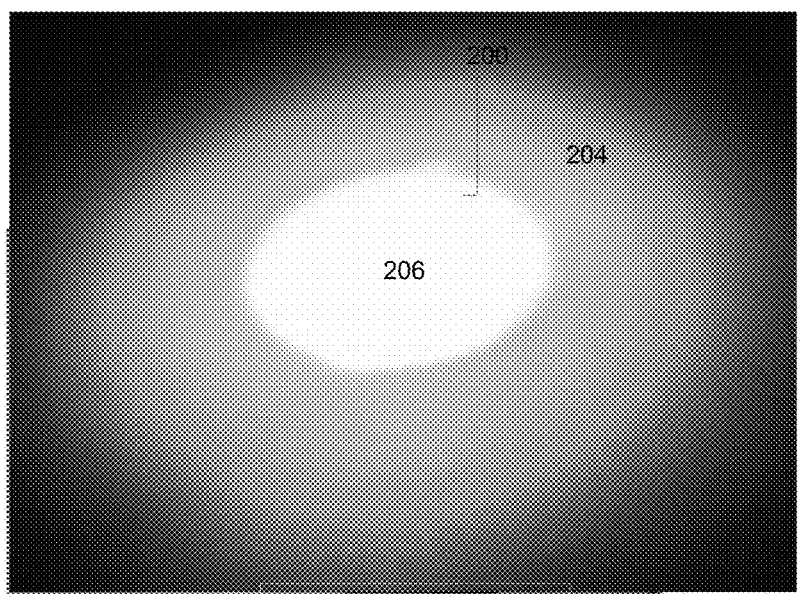
FIG. 2C illustrates the emission from the phosphor under irradiation by the laser diode used to obtain the data in FIG. 2A.

FIG. 2B shows the experimental set up used to obtain the data in FIG. 2A, showing the phosphor 200 and a hole 202 through which the laser diode emission passes to reach the phosphor. FIG. 2C illustrates the yellow emission 204 from the phosphor 200 under irradiation by the laser diode used to obtain the data in FIG. 2A, wherein the combination of the emission 204 and radiation/light from the laser diode forms white light 206.

Alternatives and Modifications

It is believed that ceramic or polycrystalline phosphor samples may be resilient to damage at these high power densities in a manner similar to the single crystal phosphor. Ceramic or polycrystalline phosphors of such resilience may be made with materials other than Ce:YAG, thereby allowing for varied color emission. This enables the use of near-UV laser diodes for excitation. Further, such phosphors would allow for greatly increased color rendering index values.

Process Steps

Figure 3:
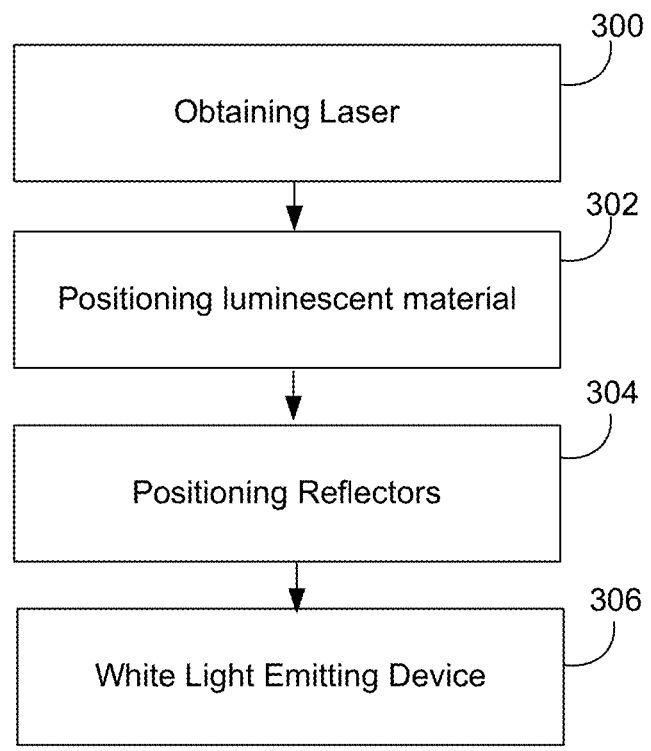
FIG. 3 is a flowchart illustrating a method of fabricating a white light emitting device, according to one or more embodiments of the invention.

FIG. 3 (referring also to FIG. 1) is a flowchart illustrating a method of fabricating a white light emitting device or lamp.

Block 300 represents obtaining an excitation source comprising a laser (e.g., laser diode 102) emitting first electromagnetic radiation having an output power in a first wavelength range. The laser diode can emit the output power having a peak intensity corresponding to ultraviolet (UV) radiation or near UV radiation (e.g., 200-400 nm wavelength), or blue light (e.g., 450-495 nm wavelength). The laser diode can have an output power of 4 watts, 5 watts, at least 4 watts, at least 5 watts, no more than 4 watts, or no more than 5 watts, for example.

Block 302 represents positioning at least one secondary electromagnetic radiation emitting species, e.g., luminescent material. The luminescent material can comprise a phosphor 108 chosen from a single crystal phosphor, a ceramic phosphor, and a polycrystalline phosphor, wherein the luminescent material emits second electromagnetic radiation in response to the luminescent material absorbing some of the first electromagnetic radiation. The second electromagnetic radiation can comprise radiation having a peak intensity corresponding to yellow light (e.g., 570-590 nm wavelength). The phosphors can comprise a red phosphor emitting red light and a green phosphor emitting green light in response to the first electromagnetic radiation. The phosphor can further include a blue phosphor emitting blue light in response to the first electromagnetic radiation, thereby forming a red-green-blue phosphor. The phosphors can emit the second electromagnetic radiation having a wavelength in a range 475 nm-700 nm, for example.

In one or more embodiments, the phosphor is not held in matrix of a polymer material or the phosphor is not encapsulated.

The luminescent material 108 can be positioned between a first scattering layer 114a and a second scattering layer 114b such that the output power 100 from the laser diode 102 is scattered by the first scattering layer 114a prior to being absorbed by the luminescent material 108, and the second electromagnetic radiation is scattered by the second scattering layer 114b prior to combining with the first electromagnetic radiation and forming the white light 110. The scattering layers 114a-b can also scatter the laser diode's emission (comprising the first electromagnetic radiation) to provide uniform color mixing and safer wide angle distribution of the laser diode's emission across the phosphor and/or across an output window of the white light emitting device.

Block 304 represents optionally positioning/placing reflectors 104a, 104b to re-direct the output power 100 across the luminescent material 108. The reflectors can comprise a first reflector 104a re-directing a first portion 116 of the output power emitted from the first edge 112a of the laser diode 102 towards the luminescent material 108, and a second reflector 104b re-directing a second portion 118 of the output power emitted from the second edge 112b of the laser diode 102 towards the luminescent material 108.

Block 306 represents the end result, a white light emitting device emitting white light 110, wherein a combination (e.g., at the output, such as a window, of the white light emitting device) of at least some remaining first electromagnetic radiation and the second electromagnetic radiation comprises (e.g., at least) 1100 lm of the white light, the remaining first electromagnetic radiation comprising the first electromagnetic radiation that is not absorbed by the phosphor/luminescent material. The output power incident on the phosphor/luminescent material, the luminescent material/phosphor's structure, and/or the mounting/housing for the luminescent material, can be such that:

the white light can be emitted with an efficiency of at least 75 lm/W at the intensity of 1100 lm (as InGaN laser diode technology matures, an efficiency of more than 200 lm/W could be achieved, for example, pumping the phosphor using a laser diode having a wall plug efficiency of at least 80%);

the white light is emitted with an efficiency, in lm/W, between 85% and 100% of a peak efficiency (in lm/W), for the white light having an intensity in a range of 500-1100 lm;

the white light has a color rendering index of at least 60; and/or the white light has a color temperature of at most 7300 Kelvin(K) or the white light has a color temperature in a range of 3000-7300 K.

In one or more embodiments, the output of the laser irradiating the phosphor is configured such that emission from the laser, incident on a viewer's eye, has a power and emission pattern resulting in brightness/angular area that is no higher than that of the sun when it reaches the earth. In one or more embodiments, scattering or diffusion layers can be included to scatter the narrow beam laser emission from the laser such that the radiation viewed by a user is at a safe level. One benefit of powdered phosphor is that the collection of particles works as a diffuser. However, due to failure of the encapsulating matrix media and decreased thermal conductivity, one or more embodiments of the present invention use the "transparent" single crystal phosphor material. One or more embodiments of the invention also use ceramic phosphors, because ceramic phosphors have the potential for self-diffusion of the laser emission (as with powder) but do not incorporate organic media which cannot hold up to the significant laser-phosphor thermal interaction.

Stability as a function of time for the white light emitting device, including the Ce:YAG phosphor used in the measurement of FIG. 2A, has been measured. The measurements show that there was no measurable change in white light output after the single crystal phosphor [2](measured in FIG. 2A) was irradiated for at least 10 minutes with emission from LD1 or LD2 (when LD1 or LD2 were operating at a current of 3 A). The silicone rubber encapsulated powdered YAG:Ce, on the other hand, burns faster than we are capable of measuring at sufficient power levels (the encapsulated powdered YAG:Ce burned when around 1W power was incident on the encapsulated powdered YAG:Ce from LD1 (LD1 operating current at or above 750 milliamps (mA)).

Thus, a device according to one or more embodiments of the invention can be such that the white light's intensity at 1100 lm is not reduced, and/or the phosphor is not degraded, after 10 minutes of operation of the device.

Advantages and Improvements

The present invention comprises a white light emitting device comprised of a laser (e.g., laser diode) and a single crystal, ceramic, or polycrystalline phosphor, or luminescent material. In one or more embodiments, use of a single crystal, ceramic, or polycrystalline phosphor as a wavelength converter allows the production of white light without damage to, or degradation of, the phosphor material at the high optical power densities present with the laser diode.

Experiments by the inventors have shown that using phosphors suspended in polymer media as typically found in LED white light emitters will become damaged at high optical power densities. However, their testing has shown that use of a single crystal phosphor allows for the emission of greater than 1100 lm of white light without damage or degradation to the single crystal phosphor. This enables the replacement of a traditional incandescent light bulb with a single laser diode requiring much less epitaxial wafer area than common LED-based white sources comprised of 10-20 or more LEDs.

NOMENCLATURE

One or more embodiments of the present invention are directed to laser diodes comprised of III-nitride materials, where the terms "Group III-nitride" or "III-nitride" or "nitride" refers to any alloy composition of the (Ga,Al,In,B)N semiconductors having the formula $Ga_wAl_xIn_yB_zN$ where $0 \le w \le 1$, $0 \le x \le 1$, $0 \le y \le 1$, $0 \le z \le 1$, and $w+x+y+z=1$. However, laser diodes fabricated from other materials could also be used.

The III-nitride laser diodes can be nonpolar laser diodes, wherein the spontaneous and piezoelectric polarization effects in GaN or III-nitride based laser diode are eliminated by growth of the laser diode on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga,Al,In,B)N laser diodes is to grow the devices on semi-polar planes of the crystal to form semipolar laser diodes. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

Polar c-plane laser diode devices can also be fabricated. The Gallium or Ga face of GaN is the $c^+$ or (0001) plane, and the Nitrogen or N-face of GaN or a III-nitride layer is the c or (000-1) plane.

A light-emitting device is defined herein as an electrically-injected device where charge carriers are generated that recombine to emit light. III-nitride light-emitting devices can be used as the excitation source in solid state lighting systems, which are typically designed with primary goal of generating high-efficiency visible lighting.

An excitation source (e.g., laser) is defined herein as a light-emitting device that is used to optically pump another material (e.g., phosphor) that emits light at a different wavelength.

REFERENCES

The following references are incorporated by reference herein.

[1] specification sheet downloaded on Nov. 2, 2015 from the website listed as "https://sites.google.com/site/dtrlpf/_/rsrc/1395557005568/home/diodes/ndb7a75-3-5w-445 nm-diodes/NDB7A75.png."
[2] specification sheet downloaded on Nov. 2, 2015 from the website listed as "https://mkt-intl.com/materials/single-crystals-optical-materials/scintillator-crystals/#YAG:Ce."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A white light emitting device, comprising:
   a laser diode emitting first electromagnetic radiation having an output power in a first wavelength range; and
   at least one phosphor chosen from a single crystal phosphor, a ceramic phosphor, and a polycrystalline phosphor, the phosphor positioned to emit second electromagnetic radiation in response to the phosphor absorbing some of the first electromagnetic radiation;
   wherein:
   the phosphor is not held in an organic medium, and
   a combination of at least some remaining first electromagnetic radiation and the second electromagnetic radiation comprises at least 1100 lumens of white light, and the remaining first electromagnetic radiation comprises the first electromagnetic radiation that is not absorbed by the phosphor.
2. The device of claim 1, wherein the white light is emitted with an efficiency of at least 75 lm/W at the intensity of 1100 lumens.
3. The device of claim 1, wherein the output power incident on the phosphor and the phosphor's structure are such that the white light is emitted with an efficiency, in lumens per watt, between 85% and 100% of a peak efficiency, for the white light having the intensity in a range of 500-1100 lumens.
4. The device of claim 1, wherein the white light has a color rendering index of at least 60.
5. The device of claim 1, wherein the white light has a color temperature of at most 7300 K.
6. The device of claim 1, wherein the laser diode comprises an edge-emitting III-nitride laser diode emitting the output power having a peak intensity corresponding to ultraviolet (UV) radiation or blue light.
7. The device of claim 1, wherein the first electromagnetic radiation comprises blue or ultraviolet radiation, the second electromagnetic radiation comprises radiation having a peak intensity corresponding to yellow light, and the combination of the blue or ultraviolet light and the yellow light comprises the white light.
8. The device of claim 1, wherein the phosphor comprises a Ce:YAG phosphor.
9. The device of claim 1, wherein the phosphor is incorporated into the laser diode's packaging.
10. The device of claim 1, wherein one or more sides of the phosphor are roughened to promote uniform mixing of the laser diode's emissions, comprising the first electromag- netic radiation, with the phosphor's emissions comprising the second electromagnetic radiation.

11. The device of claim 1, further comprising a scattering layer added before, after, or before and after the phosphor to provide uniform color mixing and safer wide angle distribution of the laser diode's emission, comprising the first electromagnetic radiation, across the phosphor and/or an output of the white light emitting device.

12. The device of claim 1, further comprising reflectors placed to re-direct the output power across the phosphor.

13. The device of claim 12, wherein:
the laser diode is an edge emitting laser diode having a first edge and a second edge,
the laser diode sits on a header,
the reflectors comprise:
a first reflector re-directing a first portion of the output power emitted from the first edge towards the phosphor, and
a second reflector re-directing a second portion of the output power emitted from the second edge towards the phosphor,
the phosphor is between a first scattering layer and a second scattering layer such that:
the output power is scattered by the first scattering layer prior to being absorbed by the phosphor, and
the second electromagnetic radiation is scattered by the second scattering layer prior to combining with the first electromagnetic radiation and forming the white light.

14. The device of claim 1, wherein the phosphor is the single crystal phosphor.

15. The device of claim 1, wherein the phosphor is the ceramic phosphor.

16. The device of claim 1, wherein the phosphor is the polycrystalline phosphor.

17. The device of claim 1, wherein the phosphor is not held in matrix of a polymer material.

18. The device of claim 1, wherein the white light's intensity at 1100 lm is not reduced after 10 minutes of operation.

19. The device of claim 1, wherein the output power is at least 4 Watts.

20. A method of fabricating a white light emitting device, comprising:
obtaining a laser diode emitting first electromagnetic radiation having an output power in a first wavelength range; and
positioning at least one phosphor chosen from a single crystal phosphor, a ceramic phosphor, and a polycrystalline phosphor, wherein:
the phosphor emits second electromagnetic radiation in response to the phosphor absorbing some of the first electromagnetic radiation,
the phosphor is not held in an organic medium, and
a combination of some remaining first electromagnetic radiation and the second electromagnetic radiation comprises 1100 lumens of white light, the remaining first electromagnetic radiation comprising the first electromagnetic radiation that is not absorbed by the phosphor.

21. The method of claim 20, wherein the output power is at least 4 Watts.

* * * * *